United States Patent
Gilbert

[19]

[11] Patent Number: 6,064,277

[45] Date of Patent: May 16, 2000

[54] AUTOMATIC BIASING SCHEME FOR REDUCING OSCILLATOR PHASE NOISE

[75] Inventor: Barrie Gilbert, Portland, Oreg.

[73] Assignee: Analog Devices, Inc., Norwood, Mass.

[21] Appl. No.: 09/032,180

[22] Filed: Feb. 27, 1998

[51] Int. Cl.[7] .................................................. H03B 5/08
[52] U.S. Cl. ..................... 331/117 R; 331/74; 331/109; 331/175; 331/183; 331/186
[58] Field of Search ............................. 331/183, 117 R, 331/175, 117 FE, 167, 109, 74, 185, 186, 172, 177 V

[56] References Cited

U.S. PATENT DOCUMENTS

| | | | |
|---|---|---|---|
| 3,815,048 | 6/1974 | Hamlet | 331/109 |
| 3,824,491 | 7/1974 | Treadway | 331/109 |
| 4,918,406 | 4/1990 | Baumbach et al. | 331/117 R |
| 5,818,306 | 10/1998 | Lee et al. | 331/117 FE |

*Primary Examiner*—Arnold Kinkead
*Attorney, Agent, or Firm*—Marger Johnson & McCollom, P.C.

[57] ABSTRACT

A drive circuit for an oscillator having an LC tank reduces phase noise by maximizing the oscillation amplitude and minimizing the drive to the tank. The drive circuit utilizes a capacitive attenuator network for level shifting the oscillation signal before feeding it back to the drive transistors in the drive circuit, thereby allowing a large peak voltage swing across the tank without saturating the transistors. An adaptive control circuit controls the biasing of the drive transistors and reduces the drive to the tank when the maximum oscillation amplitude is reached so that the drive circuit replenishes just the minimum amount of energy lost in the tank during each cycle, thereby minimizing the coupling of active circuit noise into the tank.

26 Claims, 5 Drawing Sheets

AUTOMATIC BIASING SCHEME FOR REDUCING OSCILLATOR PHASE NOISE

BACKGROUND OF THE INVENTION

1. Field of the Invention

This invention relates generally to oscillator circuits, and more particularly, to a biasing scheme for reducing the phase noise of an oscillator circuit employing an LC tank.

2. Description of the Related Art

High-frequency oscillators are of fundamental importance in all communications systems. Their most important attributes are: spectral purity; ease of frequency control (including, in some instances, tuning range); power consumption; and ease of integration in monolithic form, since most modern communications systems must be manufacturable at low cost. The present invention addresses all of these imperatives with special emphasis on spectral purity.

The design of high-frequency oscillators based on the use of LC resonant tanks is fairly easy for most routine applications. However, in many modern communication systems such as GSM, the performance requirements are very stringent, and the design is consequently more demanding. In particular, it is essential to produce an output spectrum which is very pure. The idea of spectral purity involves two different and, in principle, unconnected qualities. First, it may refer to the harmonic distortion of the oscillator output. In some applications, such as an oscillator intended for use in driving a mixer in a receiver, harmonic distortion is not of direct importance (though even-order distortion may be troublesome). In other applications, the lack of spectral purity due to the presence of harmonics can be addressed by the addition of filters.

However, filters are ineffective in dealing with the second kind of spectral impurity, generally described as "phase noise". This can be thought of as a smearing of the power spectrum across the frequency domain due to rapid, non-coherent frequency modulation by noise energy associated with the complete oscillator, comprising, in the present context, a passive LC tank circuit coupled to an active driving circuit. The noise in the tank itself is generated by any lossy elements such as the series resistance of the coil (L), dielectric losses in the capacitor (C) and shunt losses in any dissipative load placed across the tank. Often, a varactor diode is used to provide voltage-control of the oscillator, and its series resistance is also a source of noise. However, these sources in themselves are generally not dominant. Rather, they lead to a lowering of the selectivity of the tank, often expressed in terms of the quality factor "Q", and it is this reduced ability of the tank to reject wideband noise from the active elements which is troublesome. The noise power associated with the transistors in the active drive circuit, notably the base resistance of a bipolar transistor, or the channel resistance of an FET, as well as shot noise components, deliver noise to the tank in the process of supporting the oscillation amplitude. Further excess noise occurs whenever these active elements enter a region of overdrive of a particular kind.

FIG. 1 is a schematic diagram of a prior art oscillator circuit having an LC tank and accompanying drive circuit. Although the circuits described herein will be explained with a view to implementation in monolithic integrated circuits for use in radio frequency (RF) oscillators, the principles generally apply in other contexts as well. The circuit of FIG. 1 includes an LC tank which is made up of a center-tapped inductor L, and a capacitor C. A voltage source $V_S$ provides DC power to the circuit through the center tap of the inductor L. The tank is driven by a drive circuit 10, also known as a negative impedance converter ("NIC"), formed by transistors Q1 and Q2, and bias current source CS1 which generates a tail current $I_T$.

The inductor L and capacitor C usually have parasitic (intrinsic) resistances which can be modeled as resistors connected in series with the inductor and capacitor. However, to simplify the analysis, the parasitics, as well as the load resistance, can be mathematically transformed and combined for modeling as the single resistor R in FIG. 1. The load resistance includes the input impedance seen looking into the input of any circuit the tank is used to drive, for example, a differential pair of transistors. The load resistance also accounts for other loading effects such as losses from dielectric effects, eddie currents in the substrate material, and radiation. For convenience, the effective resistance from all the above-mentioned sources will be referred to simply as the load resistance.

When the circuit of FIG. 1 begins oscillating, the tank voltage causes the tail current $I_T$ to commutate back and forth between nodes N1 and N2 in response to the voltages in the tank, thereby sustaining the oscillation.

A problem with the circuit of FIG. 1, however, is that it is too noisy for use in high-frequency applications where high spectral purity is required.

Another problem with the circuit of FIG. 1 is that its operation is susceptible to variations in the load resistance and component tolerances, as well as variations in the values of the inductor, the capacitor, and their parasitic resistances, caused by semiconductor process variations.

Accordingly, a need remains for a scheme for improving the performance of an oscillator circuit.

SUMMARY OF THE INVENTION

Therefore, it is an object of the present invention to reduce the phase noise of an oscillator circuit.

Another object of the present invention is to reduce the susceptibility of an oscillator circuit to component tolerances and processing variations.

A further object of the present invention is to reduce the cost of an oscillator circuit.

To accomplish these and other objects, a drive circuit for an LC tank oscillator constructed in accordance with the present invention achieves the highest possible performance by maximizing the oscillation amplitude while minimizing the overdrive to the tank. This is achieved using an improved circuit topology to maximize the oscillation amplitude, and an adaptive bias circuit controlled by a detector that monitors the oscillator output and quickly lowers the bias drive as soon as the set-point amplitude is reached.

One aspect of the present invention is a drive circuit for an LC tank, the drive circuit comprising: a first terminal for coupling the drive circuit to the LC tank; a second terminal for coupling the drive circuit to the LC tank; a first transistor coupled to the first terminal for driving the LC tank responsive to a signal from the second terminal; a second transistor coupled to the second terminal for driving the LC tank responsive to a signal from the first terminal; a first attenuator network coupled between the second terminal and the first transistor for attenuating the signal to the first transistor; and a second attenuator network coupled between the first terminal and the second transistor for attenuating the signal to the second transistor. The attenuator shifts the level of the oscillation signal before feeding it back to the transistors, thereby allowing the oscillation amplitude to increase without saturating the transistors.

The first attenuator network includes a first capacitor coupled between the second terminal and the first transistor; and the second attenuator network includes a second capacitor coupled between the first terminal and the second transistor.

Another aspect of the present invention is an automatic control circuit for an LC tank circuit, the automatic control circuit comprising: a drive circuit for driving the tank circuit responsive to a control signal; a detector circuit coupled to the tank circuit for detecting the amplitude of oscillation of the tank circuit; and an integrator circuit coupled between the detector circuit and the drive circuit for generating the control signal responsive to the oscillation amplitude of the tank circuit.

The drive circuit includes first and second terminals for coupling the drive circuit to the tank circuit; and the detector circuit includes: a first diode coupled between the first terminal of the tank circuit and the integrator circuit; and a second diode coupled between the second terminal of the tank circuit and the integrator circuit.

The integrator circuit includes: a capacitor coupled to the detector circuit; and a current source coupled to the capacitor and the detector circuit for charging the capacitor responsive to the oscillation amplitude of the tank circuit. In one embodiment, the integrator circuit further includes an input for receiving a reference signal and generates the control signal responsive to the reference signal, thereby controlling the oscillator amplitude responsive to the reference signal.

The drive circuit includes: first and second terminals for coupling the drive circuit to the tank circuit; a first transistor coupled to the first terminal for driving the tank circuit responsive to the control signal; a second transistor coupled to the second terminal for driving the tank circuit responsive to the control signal; and a bias circuit coupled to the first and second transistors for biasing the first and second transistors responsive to the control signal.

A further aspect of the present invention is a method for controlling a drive circuit for an LC tank circuit, the drive circuit having first and second transistors for driving the tank circuit, and a bias circuit coupled to the first and second transistors, the method comprising: detecting the oscillation amplitude of the tank circuit; generating a control signal responsive to the oscillation amplitude of the tank circuit; and controlling the bias circuit responsive to the control signal, thereby controlling the oscillation amplitude of the tank circuit so as to prevent the first and second transistors from saturating.

The foregoing and other objects, features and advantages of the invention will become more readily apparent from the following detailed description of a preferred embodiment of the invention which proceeds with reference to the accompanying drawings.

DETAILED DESCRIPTION

Sources of Phase Noise

As discussed above, one source of noise in the circuit of FIG. 1 is the noise contributed by the various resistances associated with the transistors Q1 and Q2 in the drive circuit, notably the base resistances of the bipolar junction transistors Q1 and Q2 (or the channel resistances if FETs are used for Q1 and Q2), and also shot noise components, all of which deliver nose to the tank in the process of supporting the oscillation amplitude. The perturbation effects of the noise contributed by the drive circuit cause instantaneous variations in frequency known as phase noise in a resonant context and "jitter" in a pulse context.

The noise contributed by the drive circuit can be minimized by operating the tank circuit at the maximum attainable oscillation amplitude. This is because the total energy stored in the tank (which is a function of the peak voltage amplitude) includes both a signal energy and noise energy. As the oscillation amplitude increases, the percentage of the total energy attributed to noise from the drive circuit decreases, thereby improving the spectral purity (reducing the phase noise) of the oscillator. Therefore, it is desireable to produce the largest voltage swing possible across the tank.

Figure 1:
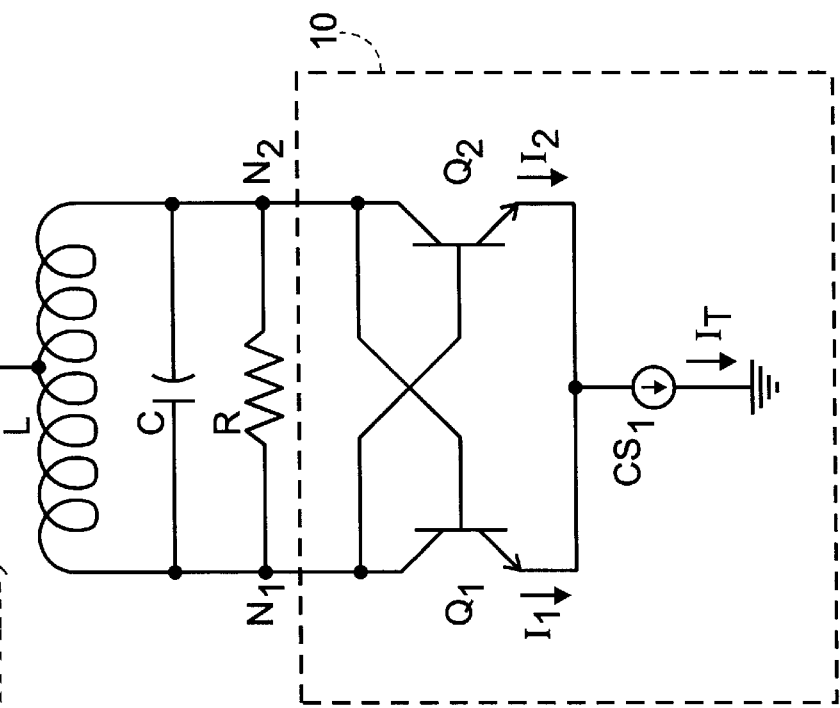
FIG. 1 is a schematic diagram of a prior art oscillator circuit having an LC tank.

However, the circuit of FIG. 1 cannot be used to generate large voltage swings across the tank circuit because the bases of transistors Q1 and Q2 are connected to the collectors of Q2 and Q1, respectively. If the voltage swing across the tank becomes more than about 400 mV, Q1 and Q2 are driven into saturation during peak voltage excursions of the tank (a condition also referred to as "crashing"), thereby introducing additional phase noise into the oscillator. The noise is injected as brief bursts either once or twice per cycle (for a single-sided or differential circuit, respectively), and it is usually due to both shot noise and ohmic contributions. If the amplitude is allowed to increase even further, the emitters of Q1 and Q2 might breakdown. Therefore, from a phase noise standpoint, trying to increase the amplitude of oscillation of the circuit of FIG. 1 beyond about 400 mV is counterproductive because the saturation of the transistors introduces additional phase noise.

The limited voltage swing available from the oscillator of FIG. 1 aggravates its susceptibility to variations in load resistance because the circuit also requires a minimum tail current to sustain oscillation. This can be better understood with reference to FIG. 2 which is a graph of the transconductance ($g_m$) of the drive circuit of FIG. 1 as a whole (in terms of the response of the current at the collectors of Q1 and Q2 to the voltage at the bases of Q1 and Q2) as a function of X, where X is a modulation factor that swings back and forth between 1 and −1, the current through the emitter of Q1 is defined as $I_1=(1+X)I_T/2$, and the current through the emitter of Q2 is defined as $I_2=(1-X)I_T/2$.

To sustain oscillation (assuming perfect transistors), the load resistance R must be less than twice the electronic $r_e$, where $r_e=1/g_m$. Since $g_m=QI_C/kT$, where $I_C$ is one-half the tail current $I_T$, the minimum tail current needed to start the oscillation is $I_T=4kT/qR$, which will be referred to as the "critical factor". Thus, the lower the load resistance, the greater the minimum tail current required to achieve start-up.

Figure 2:
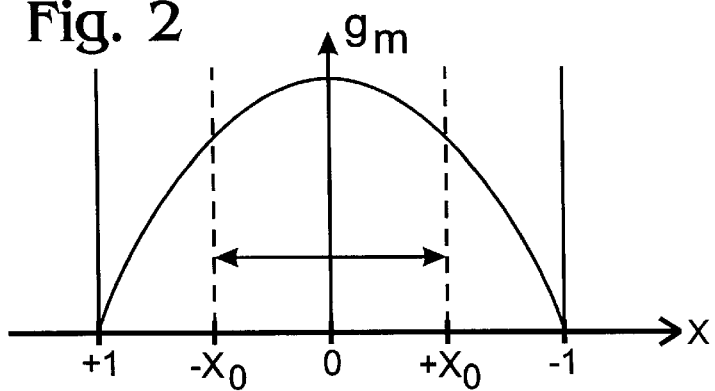
FIG. 2 is a graph of the transconductance ($g_m$) of the transistors in the drive circuit of FIG. 1 as a function of the modulation factor.

Referring to FIG. 2, the $g_m$ is at its peak value only when the amplitude of oscillation is zero, that is, when the voltage across the oscillator is exactly balanced. The transconductance $g_m$ decreases parabolically until it reaches zero at $X=\pm 1$. As soon as the amplitude is greater than zero, as for example, when X changes in response to a sinusoidal excitation voltage, there is a reduction in the $g_m$. Thus, if the tail current is set to exactly the critical factor, the oscillator just barely begins to oscillate and then stops. Therefore, to obtain a sustainable oscillation, it is necessary to $I_T$ greater than the critical value. Depending on the value of $I_T$ selected, the oscillation amplitude settles in to a steady state value, and X moves back and forth between two points such as $X_0$ and $-X_0$ as shown in FIG. 2. However, the amplitude must not be allowed to grow too large or the transistors will saturate as discussed above, thereby increasing the phase noise of the system.

Thus, $I_T$ must be chosen within a small window between the critical factor and some maximum value, otherwise, the oscillator will either fail to start, or the transistors will saturate.

If the load resistance and all of the other factors that affect the oscillation amplitude are known in advance, it would be possible to select a value of $I_T$ that is greater than the critical factor so as to assure the oscillator will start up and continue oscillating, but low enough to prevent the transistors from saturating. However, it is often impossible to know the actual value of the load resistance due to variations in temperature, load, processing, etc.

In this respect it is important to note that, in a board-level design, manual bias adjustments, although costly, can be made to the drive circuit so as to set the drive conditions to assure start-up and prevent saturation of the drive transistors. However, in a monolithic implementation, there is no opportunity for manual intervention. The oscillator must consistently meet its difficult specifications, not only over a wide range of supply voltage and temperature, but also in the presence of numerous parametric variances associated with the production of a commercial integrated circuit, and perhaps for a variety of possibly different external (board level) components.

Capacitive Coupling

Figure 3:
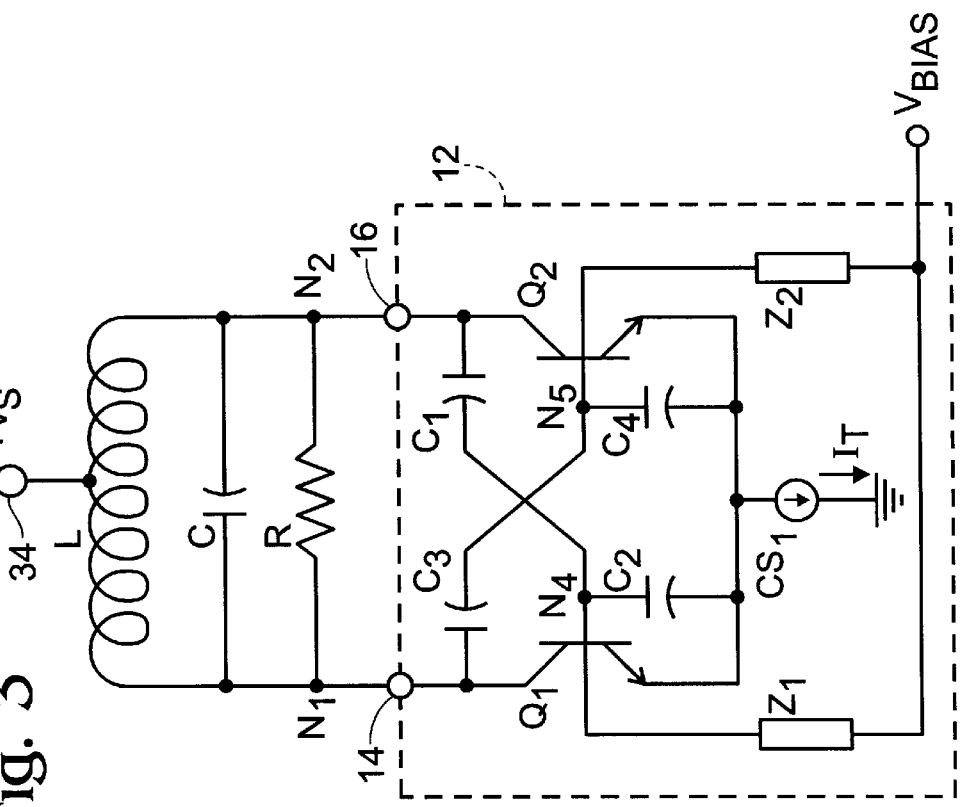
FIG. 3 is a schematic diagram of a first embodiment of an oscillator circuit in accordance with the present invention.

FIG. 3 is a schematic diagram of a first embodiment of an oscillator circuit in accordance with the present invention. The circuit of FIG. 3 includes an improved drive circuit (negative impedance converter) 12 which utilizes capacitive coupling to allow greater voltage swings across the tank circuit while maintaining the bases of tranistors Q1 and Q2 at low enough voltage levels so that they are not driven into saturation.

The circuit of FIG. 3 includes an LC tank circuit which is essentially identical to that shown in FIG. 1. The tank circuit of FIG. 3 includes a center-tapped inductor L, a capacitor C, and a resistor R which represents the composite load resistance, combined with the parasitic resistances of the inductor and the capacitor. L, C and R are all connected in parallel between nodes N1 and N2. The center tap terminal of inductor L is connected to a power supply terminal 34 for receiving a power supply voltage $+V_S$. Nodes N1 and N2 are connected to first and second terminals 14 and 16, respectively, of the drive circuit 12.

The drive circuit 12 includes first and second NPN transistors Q1 and Q2, a bias current source CS1, as well as a first attenuator network formed by capacitors C1 and C2, and a second attenuator network formed by capacitors C3 and C4. Transistor Q1 has a collector connected to the first terminal 14 of the drive circuit 12, a base connected to a node N4, and an emitter connected to a node N3. Transistor Q2 has a collector connected to the second terminal 16 of the drive circuit 12, a base connected to a node N5, and an emitter connected to node N3. The current source CS1 is connected between node N3 and a power supply common terminal GND and generates a tail current $I_T$. The current source CS1 can be implemented as a simple resistor, or it can be eliminated (i.e., node N3 can be connected directly to GND) in an oscillator circuit having a low quality factor ("Q").

The drive circuit 12 also includes first and second passive components Z1 and Z2 which are typically resistors, but can also be inductors. Z1 is connected between the base of Q1 and a bias voltage source $V_{BIAS}$. Z2 is connected between the base of Q2 and $V_{BIAS}$. The bias voltage source $V_{BIAS}$ serves as an anchor voltage for biasing transistors Q1 and Q2 through Z1 and Z2.

The first attenuator network includes a first capacitor C1, which is connected between the collector of Q1 and the base of Q2, and a second capacitor C2, which is connected between the base and emitter of Q2. The second attenuator network includes a third capacitor C3, which is connected between the collector of Q2 and the base of Q1, and a fourth capacitor C4, which is connected between the base and emitter of Q1.

The operation of the circuit of FIG. 3 is different from that of FIG. 1 in that the attenuator networks allow a much larger voltage swing across the tank. The attenuator networks perform a dual function. First, they perform a level shifting function so that the potential of the bases of Q1 and Q2 can defined independently of the potential of the collectors of Q1 and Q2. Second, they perform an attenuation function that allows the bases of Q1 and Q2 to be maintained at a much lower potential than the collectors, thereby allowing high amplitude voltage swings at the collectors.

The topology of the circuit of FIG. 3 allows the tank circuit to achieve a theoretical voltage swing of about four times $V_S$. Thus, with a 3 volt power supply, a voltage swing of about 12 volts can be obtained.

Since the circuit of FIG. 3 allows the oscillator to achieve a higher amplitude without saturating the transistors in the drive circuit, the total energy of the tank, which is a function the peak voltage, is increased, and therefore, the phase noise is reduced because the noise energy is a smaller percentage of the total tank energy.

Another advantage of the circuit of FIG. 3 is that it reduces the susceptibility of the oscillator to variations in temperature, load, processing, etc., because the window between the minimum tail current needed to assure start-up and the maximum tail current is greatly increased. In other words, the tail current $I_T$ can be set to a value that is high enough to assure that the oscillator will start (i.e., $I_T$ can be set to a value that exceeds the critical factor), but low enough to assure that the transistors in the drive circuit do not saturate.

Automatic Drive Control

Figure 4:
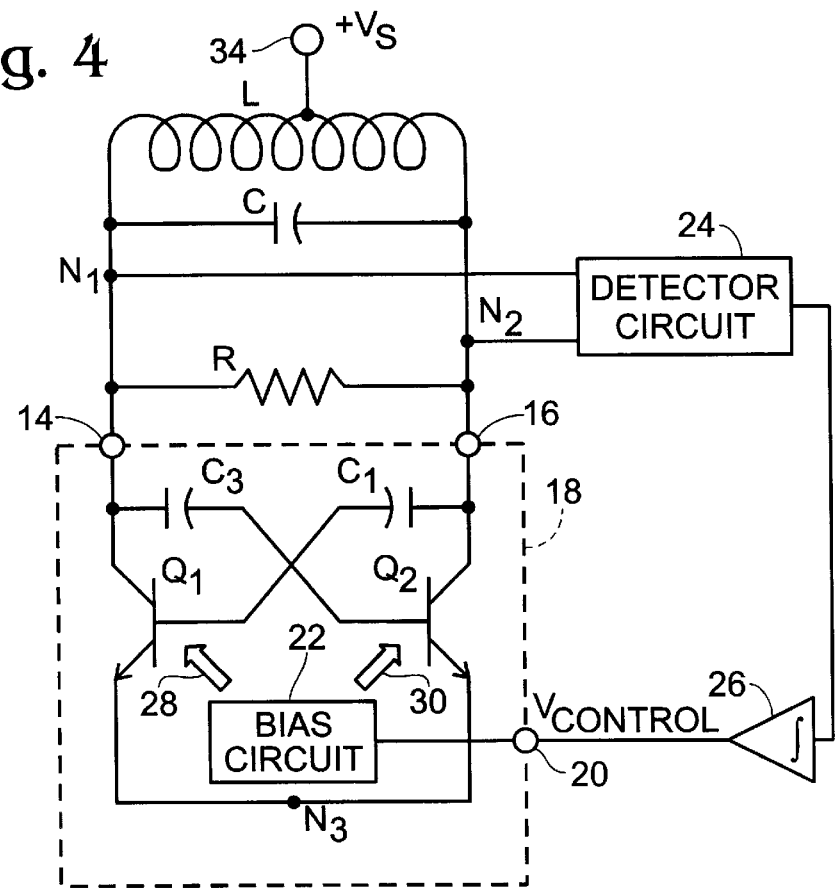
FIG. 4 is a combined schematic and block diagram of a second embodiment of an oscillator circuit in accordance with the present invention.

FIG. 4 is a schematic diagram of a second embodiment of an oscillator circuit in accordance with the present invention showing various components in block diagram form. The circuit of FIG. 4 takes advantage of the wider voltage swing allowed by the topology of the circuit of FIG. 3, and in addition, automatically controls the oscillation amplitude to provide the maximum amplitude without saturating the transistors, while minimizing the amount of drive, thereby minimizing the amount of noise contributed by the drive circuit.

The circuit of FIG. 4 includes an LC tank circuit which is essentially identical to that shown in FIGS. 1 and 3 and is coupled to a drive circuit 18 at terminals 14 and 16. The circuit of FIG. 4 also includes a detector circuit 24, an integrator circuit 26, and a bias circuit 22. The detector circuit 24 has two input terminals coupled to the tank circuit at nodes N1 and N2, and an output terminal coupled to the input terminal of the integrator 26. The integrator 26 has an output terminal coupled to the bias circuit 22 in the drive circuit 18 through a terminal 20.

The drive circuit 18 includes first and second NPN transistors Q1 and Q2, and first and second attenuating capacitors C1 and C3, all of which are connected in the same manner as those in FIG. 3. Although the attenuating capacitors C2 and C4 of FIG. 3 can be used with the circuit of FIG. 4, they are omitted from the circuit of FIG. 4, and instead, the input capacitances of Q1 and Q2 are utilized to from attenuating networks with capacitors C1 and C3, respectively, thereby achieving the same effect. Capacitors C1 and C3 are preferably as small as possible to prevent noise from the tank circuit (which is typically an external circuit in a monolithic implementation) from being coupled to the bases of Q1 and Q2.

The drive circuit 18 further includes the bias circuit 22 which receives a control signal $V_{CONTROL}$ from the integrator 26 at terminal 20. The bias circuit 22, which is shown generally interfaced to transistors Q1 and Q2 with arrows 28 and 30, adjusts the bias level of Q1 and Q2 in response to the control signal $V_{CONTROL}$ using one of several techniques described below.

The detector circuit 24 generates an output signal responsive to the oscillation amplitude of the tank circuit. The integrator 26 generates the control signal $V_{CONTROL}$ by integrating the output signal from the detector circuit 24. The bias circuit 22 controls the bias level of Q1 and Q2 in response to the control signal, and thus, automatically controls the drive circuit so that it provides just enough drive to the tank to make up for the cycle-by-cycle losses in the load, thereby maintaining the oscillation amplitude while minimizing the overdrive to the tank. Since the overdrive is minimized, the phase noise caused by the perturbation effects associated with driving the tank is also minimized.

Figure 5:
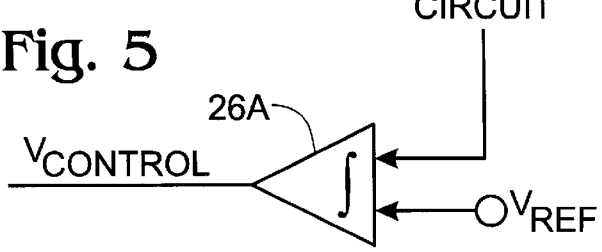
FIG. 5 is a block diagram of an alternative embodiment of the integrator of FIG. 4 in accordance with the present invention.

FIG. 5 is a block diagram of an alternative embodiment of an integrator circuit 26A which can be substituted for the integrator 26 in FIG. 4. In addition to the output and input shown in FIG. 4, the integrator 26A of FIG. 5 includes an additional input $V_{REF}$ for providing an operating setpoint voltage. The integrator 26A performs a summing operation on $V_{REF}$ and the signal from the detector circuit, thereby providing control of the oscillation amplitude by varying the input signal $V_{REF}$.

Figure 6:
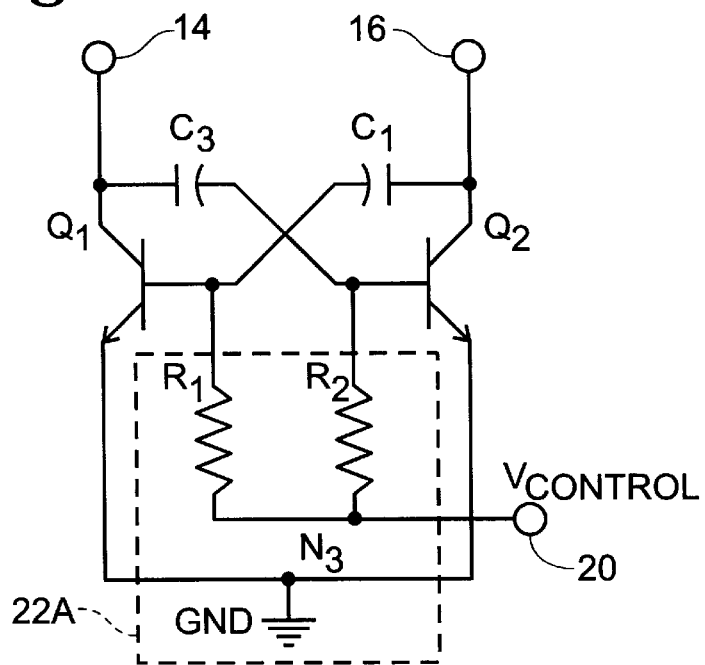
FIG. 6 is schematic diagram of a first embodiment of the bias circuit of FIG. 4 in accordance with the present invention.

A first general embodiment of the bias circuit 22 of FIG. 4 is shown at 22A in FIG. 6. The bias circuit 22A includes a first resistor R1 connected between the base of transistor Q1 and the control terminal 20, and a second resistor R2 connected between the base of transistor Q2 and the control terminal 20. Node N3, which is connected to the emitters of Q1 and Q2, is grounded. The bias circuit 22A essentially turns Q1 and Q2 into their own current sources and allows the drive circuit 18 to control the oscillation amplitude in response to the control signal generated by the control circuit formed by detector circuit 24, and integrator circuit 26.

Figure 7:
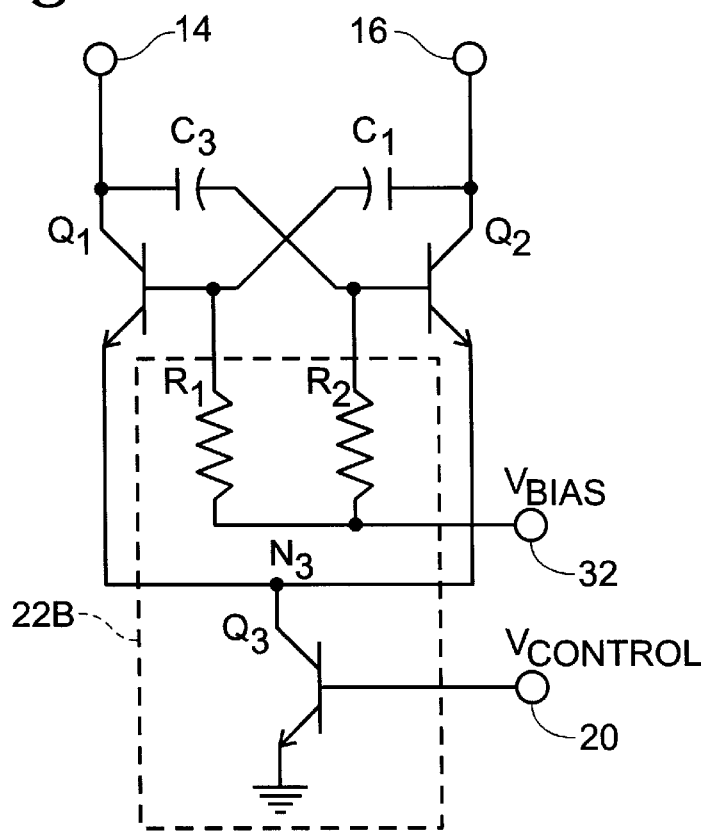
FIG. 7 is schematic diagram of a second embodiment of the bias circuit of FIG. 4 in accordance with the present invention.

A second general embodiment of the bias circuit 22 of FIG. 4 is shown at 22B in FIG. 7. The bias circuit 22B includes a first resistor R1 connected between the base of transistor Q1 and bias terminal 32, and a second resistor R2 connected between the base of transistor Q2 and bias terminal 32. Bias circuit 22B also includes an NPN transistor Q13 which has a collector connected to node N3, an emitter connected to GND, and a base which is connected to the control terminal 20.

A fixed bias signal $V_{BIAS}$ is applied to the bias terminal 32 to act as an anchor voltage for the bases of Q1 and Q2. The bias circuit 22B varies the tail current through Q1 and Q2 in response to the control voltage $V_{CONTROL}$, thereby causing the drive circuit to control the drive to the tank.

As with components Z1 and Z2 in FIG. 3, resistors R1 and R2 in FIGS. 6 and 7 can be implemented as inductors as well. Furthermore, although the drive circuits shown in FIGS. 4, 6 and 7 are shown with capacitive attenuators between the bases and collectors of Q1 and Q2, the control and bias circuits of FIGS. 4, 6 and 7 can also work with a drive circuit in which the bases of Q1 and Q2 are connected directly to the collectors, albeit, without the benefit of the extended oscillator amplitude provided by the capacitors.

Figure 8:
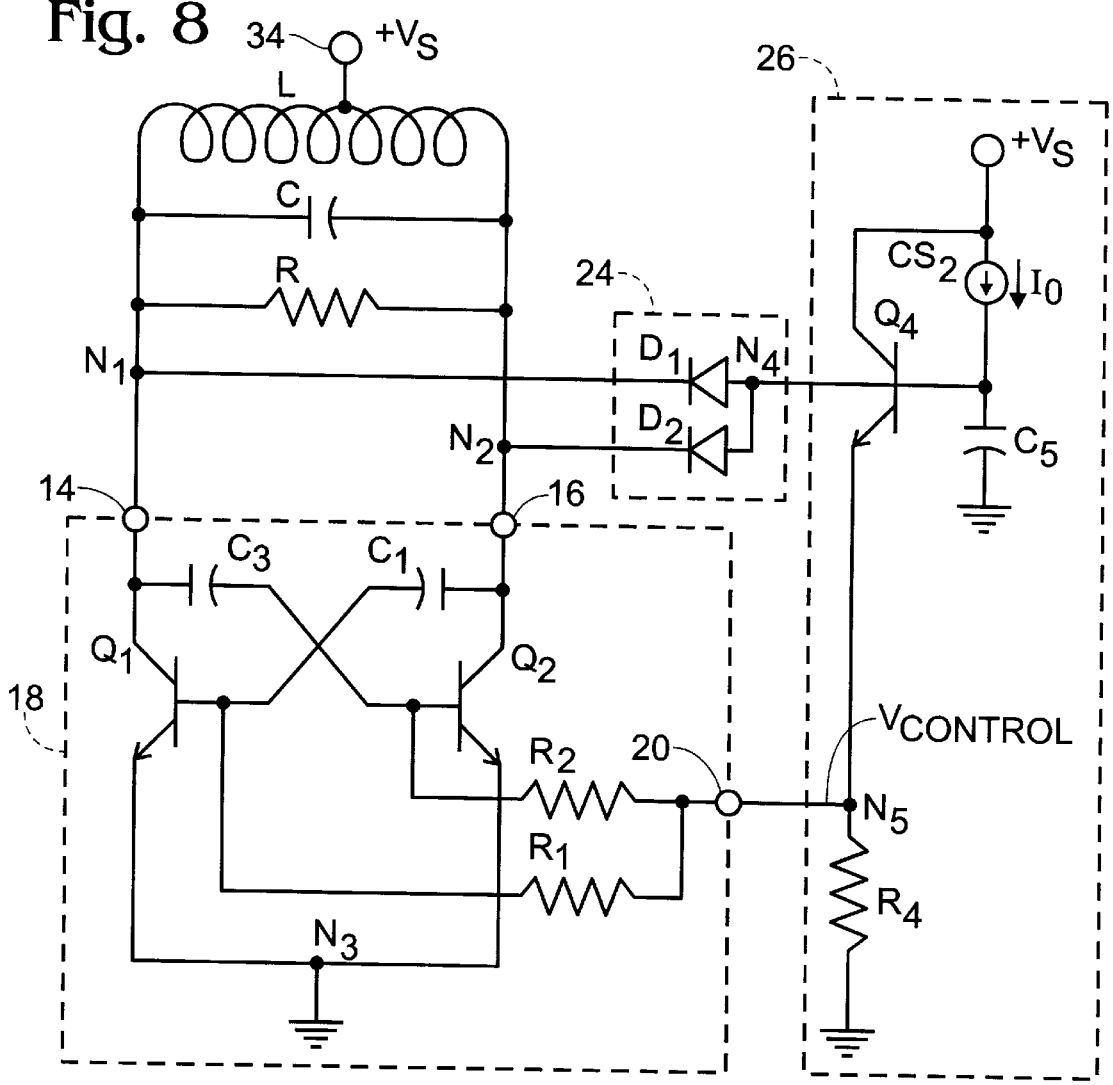
FIG. 8 is a schematic diagram of a first practical embodiment of the oscillator circuit of FIG. 4 in accordance with the present invention.

FIG. 8 is a schematic diagram of a first practical embodiment of the maximum-amplitude, minimum overdrive oscillator circuit of FIG. 4 in accordance with the present invention. The circuit of FIG. 8 includes a tank circuit that is identical to that of FIG. 4 and a drive circuit that employs the bias circuit topology of FIG. 6. The detector circuit 24 includes a first diode D1 having a cathode connected to node N1 of the tank circuit and an anode connected to a node N4. The detector also includes a second diode D2 having a cathode connected to node N2 of the tank circuit and an anode connected to node N4.

The integrator 26 includes an NPN transistor Q4, a current source CS2, a capacitor C5, and a resistor R4. Transistor Q4 has a collector connected to the power supply terminal 34, an emitter connected to a node N5, and a base connected to the detector circuit at node N4. The current source CS2 is connected between terminal 34 and the base of Q4, and capacitor CS is connected between the base of Q4 and GND. Resistor R4 is connected between node N4 and GND, and node N5 is connected to the control terminal 20 of drive circuit 18 to provide the control signal $V_{CONTROL}$ thereto.

When the oscillation amplitude is zero, nodes N1 and N2 are at the potential $+V_S$, and no current flows though diodes D1 and D2. Initially, essentially all of the current $I_0$ from CS2 flows into R4 through the emitter of Q4 (multiplied by the beta of Q4), thereby increasing the control voltage $V_{CONTROL}$ at node N5. (Very little bias current flows through R1 and R2.) This increases the bias level of Q1 and Q2, thereby increasing the drive to the tank. As the oscillation builds up, diodes D1 and D2 begin to conduct during alternate half-cycles when the potential at nodes N1 and N2 becomes low enough.

Capacitor C5 acts as a filter capacitor and forces a situation in which, on average, almost all of the current 10 flows through D1 and D2. Since node N5 is about one $V_{BE}$ above ground, and the base of Q4 is about two $V_{BE}$ above ground, nodes N1 and N2 never go lower than about one $V_{BE}$ above ground because the voltage drop across D1 and D2 is a very small $V_{BE}$ since only sense current flows through them. Thus, Q1 and Q2 always operate in linear mode and never saturate (crash).

The oscillation amplitude obtained with the circuit of FIG. 8 is almost proportional to the value of the supply voltage $V_S$.

It is important to note that diodes D1 and D2 generally do not clamp the oscillation, since clamping would create tremendous phase noise. Instead, D1 and D2 perform a sensing function (although they can have a very slight clamping effect). Diodes D1 and D2 only conduct the current $I_0$ which can be set to only a few milliamps. Since the current through D1 and D2 is limited by $I_0$, so too is their shot noise contribution to the tank.

An advantage of the circuit of FIG. 8 is that is automatically achieves the maximum oscillation amplitude without saturating the drive transistors, even without any beforehand knowledge of the bias current required to satisfy the loop gain characteristics, load requirements, etc. The oscillator starts up and then builds quickly until D1 and D2 absorb all of $I_0$ except for a very small portion used to set $V_{CONTROL}$ at a level that settles the drive at a value that provides maximum amplitude. When settled, the drive circuit delivers exactly, and no more than, the power required to serve the load, and the tank is not overdriven.

Thus, the circuit of FIG. 8 reduces phase noise in two ways: first, by maintaining the maximum oscillation amplitude; and second, by introducing less phase noise by minimizing the drive to the tank. The drive circuit just makes up for the cycle-by-cycle losses by replacing only the amount of energy lost during each cycle.

Figure 9:
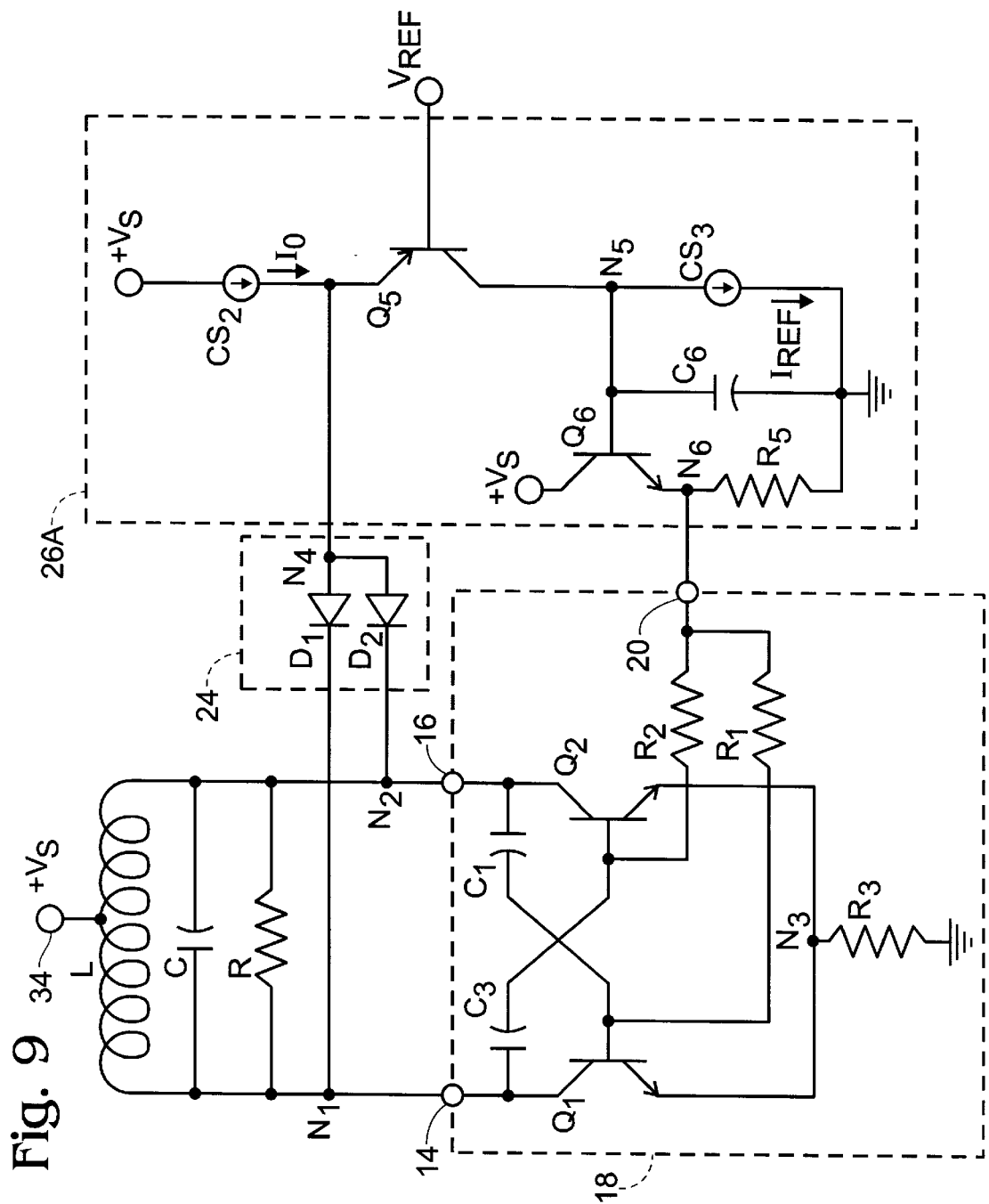
FIG. 9 is a schematic diagram of a second practical embodiment of the oscillator circuit of FIG. 4 in accordance with the present invention.

FIG. 9 is a schematic diagram of a second practical embodiment of the maximum-amplitude, minimum overdrive oscillator circuit of FIG. 4 in accordance with the present invention. The circuit of FIG. 9 includes a tank circuit, a drive circuit 18, and a detector circuit 24 that are identical to those of FIG. 8, except that a resistor R3 is connected between node N3 and GND. The circuit of FIG. 9, however, incorporates an integrator circuit 26A which provides amplitude control.

The integrator circuit 26A includes first and second currents sources CS2 and CS3, PNP transistor Q5, NPN transistor Q6, capacitor C6, and resistor R5. Transistor Q5 has an emitter connected to the detector circuit 24 at node N4, a base connected to receive a reference signal $V_{REF}$, and a collector connected to a node N5. Current source CS2 is connected between the emitter of Q5 and the power supply terminal 34.

Transistor Q6 has a collector connected to the power supply terminal 34, an emitter connected to the control terminal 20 at node N6, and a base connected to node N5. Capacitor C6 and current source CS3 are connected in parallel between node N5 and GND. Resistor R5 is connected between node N6 and GND.

When the oscillation amplitude is zero, the potential at nodes N1 and N2 are equal to $+V_S$, diodes D1 and D2 are off, and all of the current $I_0$ from CS2 flows into the emitter of Q5. The current $I_0$ is designed to be greater than the current $I_{REF}$ from current source CS3, so capacitor C6 charges. This causes the control voltage $V_{CONTROL}$ at node N6 to increase. Transistor Q6 provides voltage gain, and resistor R5 biases Q6. As the control voltage increases, transistors Q1 and Q2 are driven on, and the tank begins to oscillate. As the oscillation amplitude builds, diodes D1 and D2 begin to conduct (as in the circuit of FIG. 8) until the average current through D1 and D2 equals $I_0-I_{REF}$ (neglecting the base current through Q5 and Q6). The amplitude of oscillation is changed by adjusting the value of the reference voltage $V_{REF}$.

Capacitor C6 adds a pole to the transfer function of the control circuit. However, the tank also has a pole associated with the resonance bandwidth of the tank. Therefore, the component values should be chosen so that the pole created by C6 is dominant. I.e., the time constant associated with C6 should be large enough to prevent oscillation of the control circuit and to suppress noise from the control circuit before it is coupled to the bases of Q1 and Q2.

Resistor R3 limits the tail current through Q1 and Q2, but is not necessary with a tank that has a low Q.

The circuit of FIG. 9 provides the same benefits of maximum amplitude and minimum overdrive as the circuit of FIG. 8, but with the additional benefit of amplitude control.

A further advantage of the circuits of FIGS. 8 and 9 is that they allow the circuit designer to reduce or eliminate the phase noise that is due to the onset of junction breakdown (another form of "crashing") in the active devices. This noise occurs when the peak tank voltage becomes equal to (or even a fraction of) the breakdown voltage, since this is a region of device operation where excess noise mechanisms are very pronounced. This problem becomes more pronounced as transistor breakdown voltages become lower. The present invention provides a technique for eliminating this problem by controlling the amplitude of oscillation consistent with the available supply voltage and device breakdown voltages.

The automatic control aspects of the present invention are especially useful in monolithic implementations because it automatically compensates for variations in load resistance, process parameters, component tolerances, and the like, without requiring expensive manual adjustments at the board level.

In an alternative embodiment in which transistors Q1 and Q2 are implemented as NPN transistors in a fully complementary process, diodes D1 and D2 can be replaced by PNP transistors wherein the emitters of both transistors are connected to node N4, the collectors of both transistors are connected to GND, the base of one of the transistors is connected to node N1, and the base of the other is connected to node N2. This provides the benefit of reducing the amount of current extracted from nodes N1 and N2 because the only current required is that necessary to drive the bases of the PNP transistors. A further benefit is that it reduces the slight clamping effect that the diodes have on the tank.

In a practical monolithic embodiment, resistors are preferably inserted in series with diodes D1 and D2 to provide ESD protection, since the tank components are typically implemented as external components.

Having described and illustrated the principles of the invention in a preferred embodiment thereof, it should be apparent that the invention can be modified in arrangement and detail without departing from such principles. We claim all modifications and variations coming within the spirit and scope of the following claims.

I claim:

1. A drive circuit for an LC tank, the drive circuit comprising:

a first terminal for coupling the drive circuit to the LC tank;

a second terminal for coupling the drive circuit to the LC tank;

a first transistor coupled to the first terminal for driving the LC tank responsive to a signal from the second terminal;

a second transistor coupled to the second terminal for driving the LC tank responsive to a sign from the fist terminal;

a first attenuator network coupled between the second terminal and the first transistor for attenuating the signal to the first transistor; and a second attenuator network coupled between the first terminal and the second transistor for attenuating the signal to the second transistor;

wherein:

the first transistor has a first terminal coupled to the first terminal of the drive circuit, a second terminal coupled to a first node, and a third terminal coupled to the first attenuator network;

the second transistor has a first terminal coupled to the second terminal of the drive circuit, a second terminal coupled to the first node, and a third terminal coupled to the second attenuator network;

the first attenuator network includes a first capacitor coupled between the second terminal of the drive circuit and the third terminal of the first transistor; and the second attenuator network includes a second capacitor coupled between the first terminal of the drive circuit and the third terminal of the second transistor.

2. A drive circuit according to claim wherein:

the first attenuator network further includes a third capacitor coupled to the third terminal of the first transistor to form a divider with the first capacitor; and the second attenuator network further includes a fourth capacitor coupled to the third terminal of the second transistor to form a divider with the second capacitor.

3. An automatic control circuit for an LC tank circuit, the automatic control circuit comprising:

a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;

a detector circuit coupled to the tank circuit for detecting the amplitude of oscillation of the tank circuit;

an integrator circuit coupled between the detector circuit and the drive circuit for generating the control signal responsive to the oscillation amplitude of the tank circuit;

first attenuator network coupled between the second terminal of the drive circuit and the first transistor; and a second attenuator network coupled between the first terminal of the drive circuit and the second transistor.

4. An automatic control circuit for an LC tank circuit, the automatic control circuit comprising:

a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;

a detector circuit coupled to the tank circuit for detecting the amplitude of oscillation of the tank circuit; and an integrator circuit coupled between the detector circuit and the drive circuit for generating the control signal responsive to the oscillation amplitude of the tank circuit;

wherein the detector circuit includes:

a first diode coupled between the first terminal of the drive circuit and the integrator circuit; and a second diode coupled between the second terminal of the drive circuit and the integrator circuit.

5. An automatic control circuit for an LC tank circuit, the automatic control circuit comprising:

a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;

a detector circuit coupled to the tank circuit for detecting the amplitude of oscillation of the tank circuit; and an integrator circuit coupled between the detector circuit and the drive circuit for generating the control signal responsive to the oscillation amplitude of the tank circuit;

wherein the integrator circuit includes:

a capacitor coupled to the detector circuit; and a current source coupled to the capacitor and the detector circuit for charging the capacitor responsive to the oscillation amplitude of the tank circuit.

6. A control circuit according to claim 5 wherein the integrator circuit further includes a transistor having a first terminal coupled to the capacitor and a second terminal coupled to the drive circuit for providing the control signal to the drive circuit.

7. A control circuit according to claim 6 wherein the transistor includes a third terminal coupled to a first power supply terminal and further including a resistor coupled between the second terminal of the transistor and a second power supply terminal.

8. An automatic control circuit for an LC tank circuit, the automatic control circuit comprising:

a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;

a detector circuit coupled to the tank circuit for detecting the amplitude of oscillation of the tank circuit; and an integrator circuit coupled between the detector circuit and the drive circuit for generating the control signal responsive to the oscillation amplitude of the tank circuit;

wherein the integrator circuit:

includes an input for receiving a reference signal; and generates the control signal responsive to the reference signal, thereby controlling the oscillator amplitude responsive to the reference signal.

9. A control circuit according to claim 8 wherein the integrator circuit includes:

a capacitor;

a first current source coupled to the capacitor for charging the capacitor; and a second current source coupled to the capacitor and the detector circuit for controlling the charge rate of the capacitor responsive to the oscillation amplitude of the tank circuit.

10. A control circuit according to claim 9 wherein the integrator circuit further includes a first transistor having a first terminal coupled to the first current source, a second terminal coupled to the second current source, and a third terminal for receiving the reference signal.

11. A control circuit according to claim 10 wherein the integrator circuit further includes a second transistor having a first terminal coupled to the capacitor, and a second terminal coupled to the drive circuit for providing the control signal thereto.

12. A control circuit according to claim 11 wherein the integrator circuit further includes a resistor coupled between the second terminal of the second transistor and a power supply terminal.

13. An automatic control circuit for an LC tank circuit, the automatic control circuit comprising:
   a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;
   a detector circuit coupled to the tank circuit for detecting the amplitude of oscillation of the tank circuit; and
   an integrator circuit coupled between the detector circuit and the drive circuit for generating the control signal responsive to the oscillation amplitude of the tank circuit;
   wherein the bias circuit includes:
      a first resistor coupled between the first transistor and the integrator circuit for biasing the first transistor responsive to the control signal; and
      a second resistor coupled between the second transistor and the integrator circuit for biasing the second transistor responsive to the control signal.

14. A control circuit according to claim 13 wherein:
   the first transistor has a first terminal coupled to the first terminal of the drive circuit, a second terminal coupled to the first resistor, and a third terminal coupled to a common node; and
   the second transistor has a first terminal coupled to the second terminal of the drive circuit, a second terminal coupled to the second resistor, and a third terminal coupled to the common node.

15. An automatic control circuit for an LC tank circuit, the automatic control circuit comprising:
   a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;
   a detector circuit coupled to the tank circuit for detecting the amplitude of oscillation of the tank circuit; and
   an integrator circuit coupled between the detector circuit and the drive circuit for generating the control signal responsive to the oscillation amplitude of the tank circuit;
   wherein the bias circuit includes a current source coupled to the integrator circuit for receiving the control signal and coupled to the first and second transistors for providing bias currents to the first and second transistors responsive to the control signal.

16. A method for controlling a drive circuit for an LC tank circuit, the drive circuit having first and second transistors for driving the tank circuit, and a bias circuit coupled to the first and second transistors, the method comprising:
   detecting the oscillation amplitude of the tank circuit;
   generating a control signal responsive to the oscillation amplitude of the tank circuit; and
   controlling the bias circuit responsive to the control signal, thereby controlling the oscillation amplitude of the tank circuit so as to prevent the first and second transistors from saturating; and
   coupling the tank circuit to the first and second transistors through first and second attenuation networks, respectively, thereby increasing the maximum amplitude at which the tank circuit can oscillate without saturating the first and second transistors.

17. A method according to claim 16 further including controlling the bias circuit responsive to the control signal so as to prevent the transistors from breaking down.

18. A method according to claim 16 further including controlling the bias circuit responsive to the control signal such that the oscillation amplitude of the tank is maximized.

19. A method according to claim 16 further including:
   coupling an oscillating signal from the tank circuit to the first and second transistors; and
   shifting the level of the oscillating signal, thereby maximizing the oscillation amplitude.

20. A method according to claim 16 wherein the bias circuit controls the amount of power that the first and second transistors provide to the tank circuit, and further including minimizing the drive power to the tank.

21. A control circuit according to claim 4 wherein:
   the detector circuit includes a node preceding the integrator circuit;
   the first diode is coupled between the first terminal of the drive circuit and the node; and
   the second diode is coupled between the second terminal of the drive circuit and the node.

22. A control circuit according to claim 21 wherein the integrator circuit maintains the node at an average potential such that the first and second transistors do not saturate.

23. A control circuit according to claim 22 wherein the integrator circuit limits the current through the diodes.

24. An automatic control circuit for an LC tank circuit, the automatic control circuit comprising:
   a drive circuit for driving the tank circuit responsive to a control signal, the drive circuit having first and second terminals for coupling the drive circuit to the tank circuit, first and second transistors for driving the tank circuit, and a bias circuit coupled to the first and second transistors for biasing the first and second transistors responsive to the control signal;
   a detector circuit coupled to the tank circuit for detecting the amplitude of oscillation of the tank circuit; and
   an integrator circuit coupled between the detector circuit and the drive circuit for generating the control signal responsive to the oscillation amplitude of the tank circuit;
   wherein the detector circuit includes first means for conducting current when the oscillation amplitude of the tank circuit approaches a maximum value; and
   wherein:
   the first transistor has a collector and a base;
   the detector circuit includes a node which is maintained at about a $V_{BE}$ from the base of the first transistor;

the first means for conducting current includes a junction coupled between the node and the collector of the first transistor such that the junction begins to conduct as the collector voltage approaches the base voltage; and conduction through the junction causes the integrator circuit to reduce the drive to the tank circuit, thereby preventing the first and second transistors from saturating.

25. An automatic control circuit according to claim 24 wherein the current flowing through the junction is limited.

26. An automatic control circuit for a tank circuit, the automatic control circuit comprising:

first and second transistors configured as a negative impedance converter for driving the tank circuit;

a first attenuator network coupled to the second transistor for attenuating a first oscillating signal from the tank circuit;

a second attenuator network coupled to the first transistor for attenuating a second oscillating signal from the tank circuit;

a detector circuit coupled to the first and second transistors for detecting the oscillation amplitude of the tank circuit;

an integrator circuit coupled between the detector circuit and the drive circuit for generating a control signal responsive to the oscillation amplitude of the tank circuit; and a bias circuit coupled to the first and second transistors and the integrator circuit for controlling the first and second transistors responsive to the control signal;

wherein the detector circuit begins conducting as the oscillation amplitude approaches the maximum value at which the first and second transistors do not saturate; and wherein the integrator circuit:

increases the control signal when the oscillation amplitude is not at the maximum value, thereby increasing the drive to the tank circuit, and reduces the control signal as the detector circuit begins to conduct, thereby reducing the drive to the tank and preventing the first and second transistors from saturating.

* * * * *

UNITED STATES PATENT AND TRADEMARK OFFICE
CERTIFICATE OF CORRECTION

PATENT NO. : 6,064,277
DATED : May 16, 2000
INVENTOR(S) : Gilbert

It is certified that error appears in the above-identified patent and that said Letters Patent is hereby corrected as shown below:

Column 1,
Line 15, "addresses" should read -- address --

Column 4,
Lines 1 and 4, "is schematic" should read -- is a schematic --
Line 23, "nose" should read -- noise --

Column 5,
Line 3, "$Q1_c$" should read -- $qI_c$ --
Line 18, "to $I_T$" should read -- to make $I_T$ --

Column 6,
Line 40, "defined" should read -- define --
Line 51, "function the" should read -- function of the --

Column 7,
Line 25, "from" should read -- form --

Column 8,
Line 47, "CS" should read -- C5 --
Line 10, "10" should read -- $I_o$ --
Lines 64, 65 and 67, "$V_{BE}$" should read -- $v_{BE}$ --

Column 9,
Line 1, "$V_{BE}$" should read -- $v_{BE}$ --
Line 15, "that is automatically" should read -- that it automatically --

Column 11,
Line 5, "sign" should read -- signal --
Line 5, "fist" should read -- first --
Line 30, "claim wherein" should read -- claim 1 wherein --
Line 53, "first attenuator" should read -- a first attenuator --

UNITED STATES PATENT AND TRADEMARK OFFICE
CERTIFICATE OF CORRECTION

PATENT NO. : 6,064,277
DATED : May 16, 2000
INVENTOR(S) : Gilbert

It is certified that error appears in the above-identified patent and that said Letters Patent is hereby corrected as shown below:

<u>Column 14,</u>
Line 31, "circuit, and further" should read -- circuit, further --

Signed and Sealed this

Sixteenth Day of April, 2002

*Attest:*

JAMES E. ROGAN
*Attesting Officer*     *Director of the United States Patent and Trademark Office*